United States Patent
Parida et al.

(10) Patent No.: US 7,259,701 B2
(45) Date of Patent: Aug. 21, 2007

(54) METHOD AND STRUCTURE FOR LOSSY COMPRESSION OF CONTINUOUS DATA WITH EXTENSIBLE MOTIFS

(75) Inventors: Laxmi Priya Parida, Mohegan Lake, NY (US); Alberto Apostolico, West Lafayette, IN (US); Matteo Comin, Venice (IT)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/333,232

(22) Filed: Jan. 18, 2006

(65) Prior Publication Data

US 2007/0164880 A1    Jul. 19, 2007

(51) Int. Cl.
*H03M 7/30*    (2006.01)

(52) U.S. Cl. ............................................. 341/87; 707/6
(58) Field of Classification Search .................. 341/87, 341/106; 707/6
See application file for complete search history.

(56) References Cited

U.S. PATENT DOCUMENTS

2005/0076026 A1* 4/2005 Parida ........................... 707/6

* cited by examiner

*Primary Examiner*—Jean Bruner Jeanglaude
(74) *Attorney, Agent, or Firm*—Satheesh Karra, Esq.; McGinn IP Law Group, PLLC

(57) ABSTRACT

A method (and structure) of data processing in which data is represented in a lossy data format as a plurality of extensible motifs. Each extensible motif has at least one don't-care character enclosed by at least one non-don't-care character on a left side and at least one non-don't-care character on a right side.

20 Claims, 4 Drawing Sheets

METHOD AND STRUCTURE FOR LOSSY COMPRESSION OF CONTINUOUS DATA WITH EXTENSIBLE MOTIFS

BACKGROUND OF THE INVENTION

1. Field of the Invention

The present invention generally relates to data compression. More specifically, a new technique of lossy compression, in which extensible patterns are used to compress continuous data, is applied to data in its native form.

2. Description of the Related Art

Data compression methods are partitioned traditionally into lossy methods and lossless methods. Typically, lossy compression is applied to signals susceptible to some degeneracy without lethal consequence. Traditional lossy methods are applied in the frequency domain, rather than in the time domain, of a signal. The error due to the loss in these traditional lossy methods is spread equally throughout the data, for example, equally throughout an overall image.

SUMMARY OF THE INVENTION

In view of the foregoing description of conventional lossy compression methods, by compressing data in its native form, it is an exemplary feature of the present invention to provide a new method of lossy compression that departs from traditional lossy compression that use the frequency domain.

It is another exemplary feature of the present invention to provide a new method of lossy compression that can be applied to either text or image data streams.

It is another exemplary feature of the present invention to provide a novel compression concept using extensible patterns for continuous data and for which test cases demonstrate that 95% or more of the original data can still be recovered in lossy compression of about 40%.

To achieve the above and other exemplary features and aspects, in a first exemplary aspect of the present invention, described herein is a data processing method including receiving input data and at least one of:

when the input data comprises original data to be compressed, converting the received input data into a lossy data format wherein original data is approximated, at least partially, as at least one of:
  one or more extensible motifs, each extensible motif having at least one don't-care character enclosed on a left side by at least one non-don't-care character and on a right side by at least one non-don't-care character; and
  one or more dictionary terms, each dictionary term respectively comprising a symbol that represents at least one of the extensible motifs; and when the input data comprises data that is original data that was previously compressed into the lossy data format, the input data thereby being data to be decompressed, converting the received input data into a format that approximates the original data as a concatenation of only extensible motifs and any original data not converted into the extensible motifs.

In a second exemplary aspect of the present invention, also described herein is an apparatus, including apparatus, including at least one of:
a data compressor that:
receives input data as original data to be compressed; and
determines a plurality of extensible motifs so that the input data is at least partially approximated by a format based on the extensible motifs, each extensible motif comprising at least one don't-care character enclosed on a left side by at least one non-don't-care character and on a right side by at least one non-don't-care character; and
a data decompressor that:
receives input data represented in the format based on the extensible motifs; and
reconstructs an approximation of the original data as a representation in the extensible motifs along with any original data not converted into any extensible motifs.

In a third exemplary aspect of the present invention, also described herein is signal-bearing medium tangibly embodying a program of machine-readable instructions executable by a digital processing apparatus to perform at least one of a data compression and a data decompression wherein data is represented in a lossy data format as comprising one or more extensible motifs, each extensible motif comprising at least one don't-care character enclosed on each of a left side and a right side by at least one non-don't-care character.

Thus, the present invention provides a new method for lossy compression of data based on a new concept of extensible motifs, in which new method the data loss occurs locally in the decompressed data. Time domain is used for the compression and decompression processing, and interpolation can be used to attempt to recover some of the lost information.

BRIEF DESCRIPTION OF THE DRAWINGS

The foregoing and other exemplary features, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Figure 1:
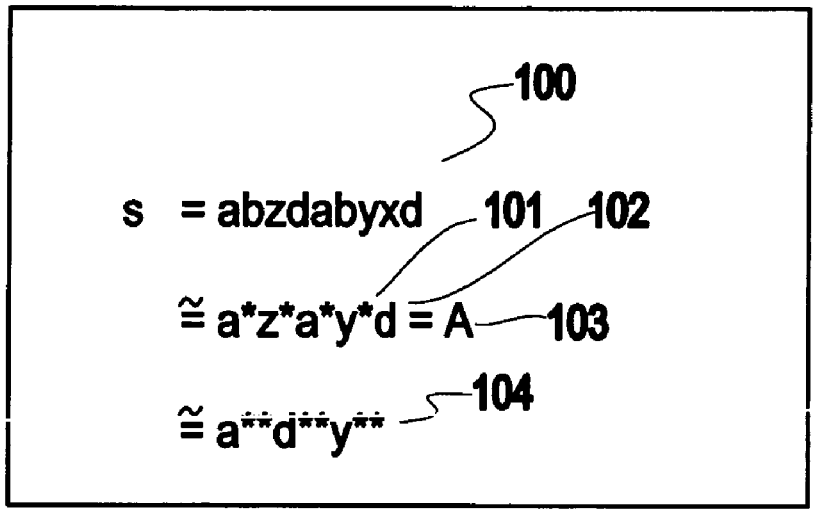
FIG. 1 shows the concept of introducing loss of information into a data string by using don't-care data.

Referring now to the drawings, and more particularly to FIGS. 1-6, exemplary embodiments of the present invention will now be described.

In contrast to the conventional method for lossy compression of transforming from the time/space domain into the frequency domain, the present invention provides a new method of lossy compression in which the compression is applied in the domain of the raw data, which is to say, the time/space domain. This new lossy compression technique results in error that is localized, rather than being equally spread throughout the data, as occurs with the traditional methods.

It is noted that one of ordinary skill in the art, after having read the details described herein, would readily be able to apply the present invention as a novel method of lossy compression in which don't-cares are purposefully introduced into an input data stream for locating repetitive patterns throughout the data. In an exemplary embodiment, the repetitiveness and compression effect are further optimized by such methods as merging the repetitive patterns to form larger, even maximal, patterns and by merging patterns having multiple numbers of don't-cares as represented by a single pattern symbology.

Turning first to FIG. 1 to introduce the concepts of the present invention, a string 100 of characters s="abzdabyxd" is presented as exemplary raw data. Using the concept of wild-card characters in search queries, in which missing characters are represented by special symbols, such as an asterisk "*" or question mark "?" or period ".", it should be clear that this string 100 would be represented as s~"a*z*a*y*d", shown as string 102 in FIG. 1, if one were willing to accept one missing character 101 for each alternate character in the string, thereby providing a lossy representation for string s.

Correspondingly, the wild card characters are considered as "don't care" information in the present invention, and the string could now be represented as corresponding to a dictionary term A="a*z*a*y*d", where "A" is an arbitrary character representing a term in a dictionary developed as part of an encoding process to transmit data string s, presumed as being part of a larger set of data.

Extending the above concept, if one were willing to accept two adjacent missing characters, then the string s might be represented as s~"ady", 104, and, with three adjacent missing characters, the string s might become "a*a***d", and so on.

In decoding the above resultant strings of dictionary terms, such as A 103, it is necessary only to have a listing of dictionary terms with their corresponding sequences. It should be clear that the don't-cares introduce a loss of information to the string s, and that the amount of information lost is directly proportional to the number of don't-cares present.

It should also be clear that at least some of the don't-care characters could be filled back in, once the decoded strings were reassembled, permitting words with don't-care characters to be reconstructed once the context of the strings become possibly recognizable following the reassembly or by other techniques such as interpolation, if the data is related to an image.

The data compression technique of the present invention is somewhat related to the concepts shown in FIG. 1 in that lossy information is due to a purposeful introduction of don't-cares.

Figure 2:
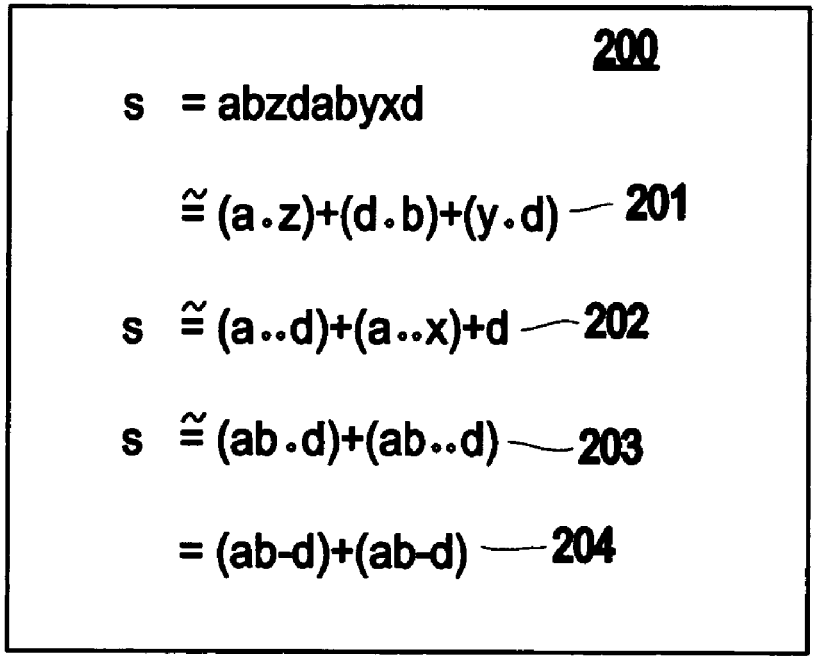
FIG. 2 shows the concept of extensible motifs used in the present invention.

FIG. 2 shows how the compression concepts 200 of the present invention compares with the wild card concept demonstrated in FIG. 1, except that don't-cares for the discussion of the present invention are represented by dot characters ".", the symbology adopted in the mathematical discussion that follows. In the method of the present invention, the input string 100 of raw data s="abzdabyxd" is broken down as represented to be a concatenation of a series of "patterns", such as s~"a.z"+"d.b"+"y.d", 201, if one don't-care is assumed, or s~"a..d"+"a..x"+"d", 202, if two don't-cares are assumed. There are also larger patterns possible from this string: s~"ab.d"+"ab.d", 203, which can be seen as being extensions of smaller patterns, thereby providing a basis for the "extensible" description.

In this last example, the two larger extensible patterns 203 can also be expressed as a single motif "ab-d", 204, where "-" corresponds to one gap (where "z" is missing) in the first occurrence and two gaps (where "y" and "x" are missing) in the second occurrence.

Thus, in the present invention, the concept of "extensibility" is related to the number of don't-cares present in each pattern cell, as well as the concept that smaller pattern units can merge into a larger pattern or that cells having different numbers of don't-cares can be represented by one pattern symbology.

In FIG. 2, each cell unit, unlike the example shown in FIG. 1, is delineated by two characters, one that defines the start of the extensible pattern and one that defines the end of the extensible pattern. The two end characters are defined in the following discussion as being "solid characters", which are separated by one or more dot characters, and, as shown in the example "ab-d", might also include characters inside the two outlying solid characters. In comparing FIGS. 1 and 2, it can be seen that delineating each pattern cell with solid characters such as shown in FIG. 2, provides cell units that do not overlap. In contrast, the example in FIG. 1, the character "a" overlaps in the example A=BC, where B="a*z*a" and C="a*y*d". It should also be noted that the motifs 203 need not have a consistent number of don't-cares, as was discussed relative to patterns 102 and 104 in FIG. 1 or pattern 201 in FIG. 2.

Figure 3:
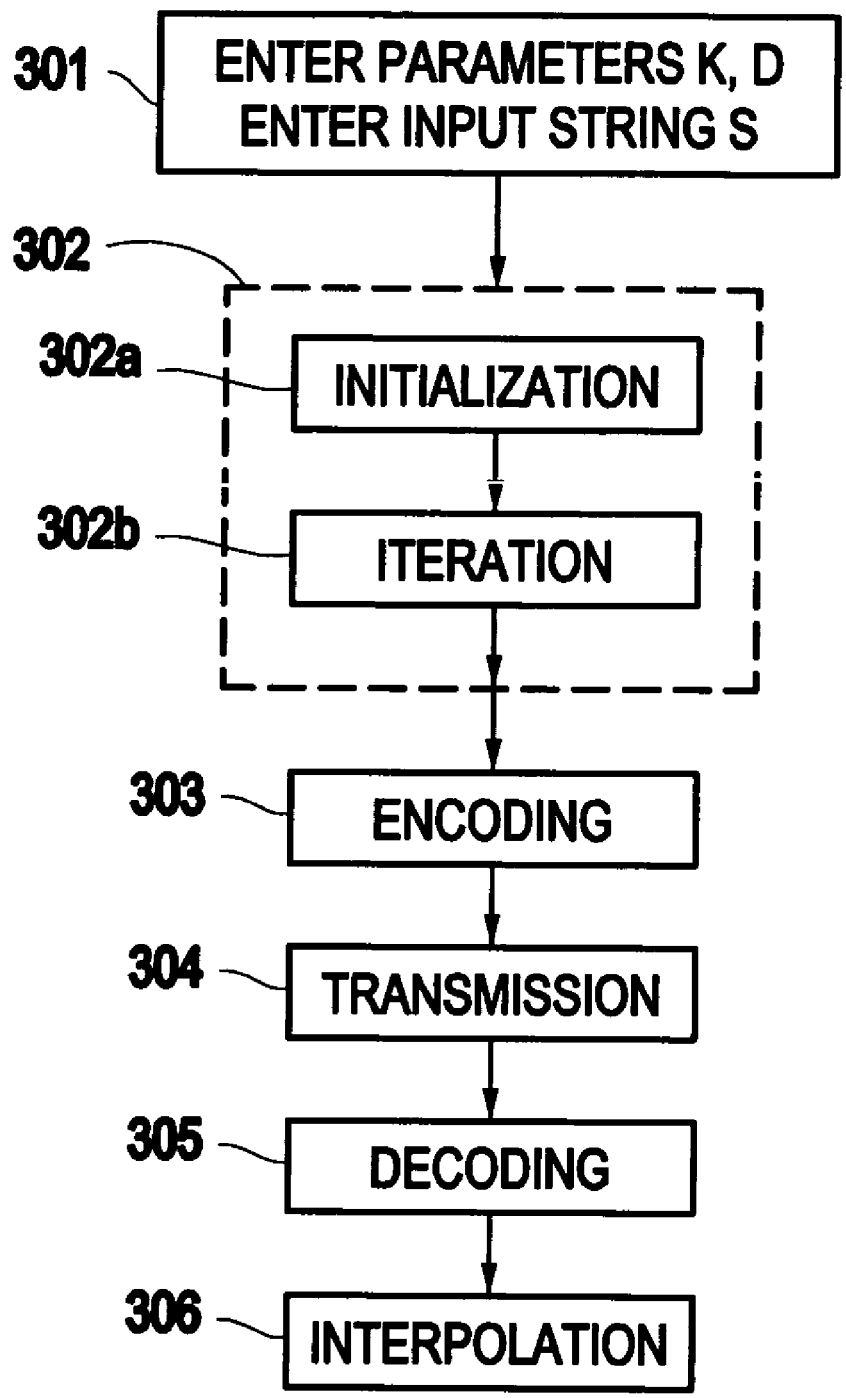
FIG. 3 shows an exemplary flowchart of the method of data compression using extensible motifs.

FIG. 3 provides an overview 300, in the abstract and in flowchart format, of concepts of the data compression technique of the present invention that uses the pattern cells exemplarily illustrated in FIG. 2. A more detailed and theoretical description is presented in the mathematical discussion below, wherein is described that pattern cells having dot characters are referred to as "motifs" and wherein is developed the technique of determining maximal motifs for the input data.

As shown in FIG. 3, the technique of the present invention begins, in step 301, with inputting parameters K and D and an input string of data, such as s="abzdabyxd".

It is important to note at this point that, although input data s is represented, in the discussion herein as characters, the present invention is equally, and perhaps even more, appropriate to continuous data patterns such as represented by pixel data of an image, since a feature of the present invention is that the information loss due to the introduction of don't-cares can be at least partially recovered by interpolation in continuous data. However, it is also noted that the present invention can also be applied to strict character strings of text data, since wild card missing characters can, in many cases, be similarly deduced by the context of remaining letters surrounding the wild cards (e.g., by using a standard dictionary).

Returning to the flowchart of FIG. 3, the parameter D is related to the number of dot characters that will be allowed in the compression. Thus, if D=2, up to two dot characters are possible. This means that each possible pattern cell will have zero, one, or two dot characters delineated by solid letters at each end. Parameter K relates to the repetition of a pattern within data string s and provides a mechanism for controlling the degree of compression. That is, if K=2, a pattern must be repeated at least twice to qualify as a unit for further consideration in the compression evaluation process. If K=5, a pattern must occur at least five times in the string.

The detection step 302 is broken down into an initialization phase 302a and an iteration phase 302b, during which the input data string s is broken down as being a collection of maximal extensible patterns consistent with input parameters D and K. In the case of the exemplary input string s="abzdabyxd" and D=K=2, the initialization phase 302a will, in a first step discussed in greater detail in the mathematical description below, develop from the input data string a set of possible patterns: ab, a.z, a..d, bz, b.d, b..a, zd, z.a, z..b, da, d.b, b..y, a.y, a..x, by, b.x, b..d, yx, y.d, and x.d, along with an occurrence list for each possible pattern.

From this set of possible patterns, in a second step of the initialization phase 302a, extensible cells are constructed by combining all patterns having the same end solid characters with at least one dot, and all extensible cells will be discarded except a set of surviving cells determined by evaluating which cells have an occurrence in the string less than K=2.

The significance of the parameter K is that a pattern that occurs only once is unique and will not lead to compression. In practice, there would be higher compression if slightly larger values of K are used, since K represents the number of times that the cell occurs in the data string undergoing the compression algorithm.

In the exemplary input string s, there are only two surviving cells ab and a-b, where a-b refers to patterns a.b or a..b.

In the iteration phase 302b, a collection of maximal extensible patterns is determined. This phrase means that the surviving cells are progressively enlarged, similar to the effect above where s~"ab.d"+"ab..d" was developed from the more basic patterns "b.d" and "b..d", and which two enlarged patterns were expressed as the single motif "ab-d".

For the exemplary input string s, the result is "a-d" where "-" has 1 to 2 gaps.

In the encoding step 303, an encoding scheme, such as a scheme based on developing a dictionary of the resultant maximal extensible patterns, is developed for an entire set of input strings. Thus, for example, if ab and a-b had been two maximal extensible patterns, then the dictionary might have allocated symbology A=ab and B=a-b for these two maximal extensible patterns.

It is noted at this point that, although alphabetical characters are used for purpose of demonstration, the method is not so constrained. Thus, any character representation can be used, including, for example, integers as expressed in various number bases such as strings of binary, hexadecimal, etc.

It is also noted that, although a text data string was used in the example above, the data could also be pixel data from an image, since pixel data is easily broken down into groups of pixels that can each be then represented as one or more characters. Thus, although the term "character" is used in this explanation, the input data is not thereby constrained to be a character string.

In step 304, the encoded data is transmitted, possibly along with a listing of the dictionary terms used for the encoding process, and in step 305, a decoder reverses the dictionary encoding of the transmitted data. In optional step 306, the decoded data might undergo a process to reconstruct some of the lost information due to don't-cares, using, for example, interpolation between surrounding values.

The Mathematical Theory of Extensible Patterns

To proceed with a more formal mathematical definition of the extensible patterns of the present invention, let s be a sequence of sets of characters from an alphabet $\Sigma \cup \{.\}$, where "." $\notin \Sigma$ denotes a don't-care (dot, for short) and the rest are solid characters. The symbol $\sigma$ is used to denote a singleton character or a subset of $\Sigma$. For character (sets) $e_1$ and $e_2$, one writes $e_1 \leq e_2$ if and only if $e_1$ is a dot or $e_1 \subseteq e_2$. Allowing for spacers in a string is what makes it extensible.

Such spacers are indicated by annotating the dot characters. Specifically, an annotated "." character is written as $.^\alpha$ where $\alpha$ is a set of positive integers $\{\alpha_1, \alpha_2, \ldots \alpha_k\}$ or an interval $\alpha=[\alpha_l, \alpha_u]$, representing all integers between $\alpha_l$ and $\alpha_u$ including $\alpha_l$ and $\alpha_u$. Whenever defined, d will denote the maximum number of consecutive dots allowed in a string. In such cases, for clarity of notation, the extensible wild card is denoted by the dash symbol "-" instead of the annotated dot character, $.^{[1,d]}$ in the string. It is noted that "-" $\notin \Sigma$.

Thus, a string of the form $a.^{[1,d]} b$ will be simply written as a-b. A motif m is extensible if it contains at least one annotated dot, otherwise m is described as being rigid. Given an extensible string m, a rigid string m' is a realization of m if each annotated dot $.^\alpha$ is replaced by $l \in \alpha$ dots. The collection of all such rigid realizations of m is denoted by R(m). A rigid string m occurs at position l on s if $m[j] \leq s[l+j-1]$ holds for $1 \leq j \leq |m|$. An extensible string m occurs at position l in s if there exists a realization m' of m that occurs at l. Note than an extensible string m could possibly occur a multiple number of times at a location on a sequence s. In this discussion, the (unique) first left-most possible occurrence at each location is of interest to explain the method. Higher data compression results the more times that an extensible string m repeats in the input data.

For a sequence s and positive integer k, $k \leq |s|$, a string (extensible or rigid) m is a motif of s with $|m|>1$ and location list $\mathcal{L}m=(l_1, l_2, \ldots, l_p)$, if both m[1] and m[|m|] are solid and $\mathcal{L}m$ is the list of all and only the occurrences of m in s. Given a motif m, let m[j1], m[j2], : : : m[jl] be the l solid elements in the motif m.

Then, the sub-motifs of m are given as follows: for every $j_i$; $j_t$, the sub-motif $m[j_i \ldots j_t]$ is obtained by dropping all the elements before (to the left of) $j_i$ and all elements after (to the right of) $j_t$ in m. It can also be characterized that m is a condensation for any of its sub-motifs. One is interested in motifs for which any condensation would disrupt the list of occurrences. Formally, let $m_1, m_2, \ldots, m_k$ be the motifs in a string s.

A motif $m_i$ is maximal in length if there exists no $m_j$, $l \neq i$ with $|\mathcal{L}m_i|=|\mathcal{L}m_j|$ and $m_i$ is a sub-motif of $m_j$. A motif $m_i$ is maximal in composition if no dot character of $m_i$ can be replaced by a solid character that appears in all the locations in $\mathcal{L}m$. A motif $m_i$ is maximal in extension if no annotated dot character of $m_i$ can be replaced by a fixed length substring (without annotated dot characters) that appears in all the locations in $\mathcal{L}m$. A maximal motif is maximal in composition, in extension, and in length.

Detection Algorithm

The input is a string s of size n and two positive integers, K and D. The extensibility parameter D is interpreted as follows:

(1) If only rigid patterns are to be discovered, then D is interpreted as the maximum number of dot characters between two consecutive solid characters.

(2) If extensible patterns are to be discovered, then up to D (or 1 to D) number of dot characters between two consecutive solid characters is allowed. The output is all maximal extensible (with D spacers) patterns that occur at least K times in s.

The algorithm works by converting the input into a sequence of possibly overlapping cells: A cell is the smallest substring in any pattern on s that has exactly two solid characters: one start character at the start and the other start character at the end position of this substring. A maximal extensible pattern is a sequence of cells.

Initialization Phase

The cell is the smallest extensible component of a maximal pattern and the string can be viewed as a sequence of overlapping cells. If no don't-care characters are allowed in the motifs, then the cells are non-overlapping. The initialization phase has the following steps.

Step 1: Construct patterns that have exactly two solid characters in them and separated by no more than D spaces or "." characters. This is done by scanning the string s from left to right. Further, for each location, the start and end positions of the pattern are stored. For example, if s=abzdabyxd and K=2, D=2, then all the patterns generated at this step are: ab, a.z, a..d, bz, b.d, b..a, zd, z.a, z.b, da, d.b, d..y, a.y, a..x, by, b.x, b.d, yx, y.d, xd, each with its occurrence list. Thus $\mathcal{I}_{ab}\{(1,2), (5,6)\}$, $\mathcal{I}_{ax}=\{(1,3)\}$ and so on.

Step 2: The extensible cells are constructed by combining all the cells with at least one dot character and the same start and end solid characters. The location list is updated to reflect the start and end position of each occurrence. Continuing the previous example, b-d is generated at this step with $\mathcal{I}_{b-d}=\{(2,4), (6,9)\}$. All cells m with $|\mathcal{I}m|<K$ are discarded. In the example, the only surviving cells are ab, b-d with $\mathcal{I}_{ab}=\{(1,2), (5,6)\}$ and $\mathcal{I}_{b-d}=\{(2,4), (6,9)\}$.

Iteration Phase

Let B be the collection of cells. If m=Extract(B), then m ∈B and there does not exist m'∈B such that m'>m holds: $m_1 > m_2$ if one of the following holds: (1) $m_1$ has only solid characters and $m_2$ has at least one non-solid character (2) $m_2$ has the "-" character and $m_l$ does not, and, (3) $m_1$ and $m_2$ have $d_1, d_2 > 0$ dot characters respectively and $d_1 < d_2$.

Further, $m_1$ is ⊙-compatible with $m_2$ if the last solid character of $m_1$ is the same as the first solid character of $m_2$. Further if $m_1$ is ⊙-compatible with $m_2$, then $m = m_1 \odot m_2$ is the concatenation of $m_1$ and $m_2$ with an overlap at the common end and start character and $\mathcal{I}'_m = \{((x, y), z) | ((x, 1), z) \in \mathcal{I}'_{m1}, ((1, y), Z) \in \mathcal{I}'_{m2}\}$. For example, if $m_1$=ab and $m_2$=b.d then $m_1$ is ⊙-compatible with $m_2$ and $m_1 \odot m_2$=ab.d. However, $m_2$ is not ⊙-compatible with $m_1$.

```
Main( )                    Iterate(m, B, Result)
{                          {
Result ← { };              G:1    m' ← m;
B ←{m_i|m_i is a cell};    G:2    For each b = Extract(B) with
For each m = Extract(B)    G:3        ((b ⊙ -compatible m')
    Iterate(m, B, Result);         OR (m' ⊙ -compatible b))
Result ← Result;           G:4        If (m' ⊙ -compatible b)
}                          G:5            m_t ← m' ⊙ b;
                           G:6            If NodeInconsistent(m_t) exit;
                           G:7            If {|𝓘_m'| = |𝓘_b|} B ← B − {b};
                           G:8            If (|𝓘_m'| ≥ K)
                           G:9                m' ← m_t;
                           G:10               Iterate(m', B, Result);
                           G:11       If (b ⊙ -compatible m')
                           G:12           m_t ← b ⊙ m';
                           G:13           If NodeInconsistent(m_t) exit;
                           G:14           If (|𝓘_m'| = |𝓘_b|) B ← B − {b};
                           G:15           If (|𝓘_m'| ≥ K)
                           G:16               m' ← m_t;
                           G:17               Iterate(m', B, Result);
                           G:18   For each r ∈ Result with Z_r = Z_m'
                           G:19       If (m' is not maximal w.r.t. r)
                                          return;
                           G:20   Result ← Result ∪ {fm'};
                           }
```

The above NodeInconsistent(m) is a routine that checks if the new motif m is non-maximal with respect to earlier non-ancestral nodes by checking the location lists. The procedure is best described by the pseudocode shown above.

Steps G: 18-19 detect the suffix motifs of already detected maximal motifs. Result is the collection of all the maximal extensible patterns.

Encodings

Each phase of the steepest descent paradigm alternates the selection of the pattern to be used in compression with the actual substitution and encoding. The sequence representation at the outset is finally pipelined into some of the popular encoders and the best one among the overall scores thus achieved is retained. This kind of process makes it impossible to base the selection of the best motif at each stage on the actual compression that will be conveyed by this motif in the end. The decision performed in choosing the pattern must be based on an estimate, that also incorporates the peculiarities of the scheme or rewriting rules used for encoding. In practice, one estimates at log(i) the number of bits needed to encode the integer i. As an example, A. Apostolico and A. Fraenkel, "Robust transmission of unbounded strings using Fibonacci representations", *IEEE Transactions on Information Theory*, vol. 33, no. 2, pp. 238{245 (1987), can be consulted for reasons that legitimate this choice.

In one scheme described by A. Apostolico and S. Lonardi, "Off-line Compression by Greedy Textual Substitution", *Proceedings of the IEEE*, 88(11): 1733-1744 (2000), all occurrences of m are eliminated, and recorded in succession are m, its length, and the total number of its occurrences followed by the actual list of such occurrences. Letting $|m|$ denote the length of m, $D_m$ denotes the number of extensible characters in m, $f_m$ the number of occurrences of m in the textstring, $s_m$ the number of characters occupied by the motif m in all its occurrences on s, $|\Sigma|$ the cardinality of the alphabet and n the size of the input string, the compression brought about by m is estimated by subtracting from the $s_m$ log $|\Sigma|$ bits originally encumbered by this motif on s, the expression $|m|$ log $|m|$+log $|m|$+$f_m D_m$ log D+$f_m$ log n+log $f_m$ charged by encoding, thereby obtaining:

$$G(m)=(s_m-|m|) \log |\Sigma|-\log |m|-f_m(D_m \log D+\log n)-\log f_m$$

This is accompanied by a loss L(m) represented by the total number of don't cares introduced by the motif, expressed as a percentage of the original length. If $d_m$ be the total number of such gaps introduced across all its occurrences, then this would be:

$$L(m)=d_m/s_m.$$

Other encodings are possible (see, e.g., A. Apostolico, M. Comin and L. Parida, \Bridging Lossy and Lossless Compression by Motif Pattern Discovery", *General Theory of Information Transfer and Combinatorics*, (2004)). In one scheme, for example, every occurrence of the chosen pattern m is substituted by a pointer to a common dictionary copy, and one adds one bit to distinguish original characters from pointers. The original encumbrance posed by m on the text is in this case (log $|\Sigma|$+1)$s_m$, from which one subtracts $|m|$ log $|\Sigma|$+$f_m D_m$ log D+log $|m|$+$f_m$(log r+1), where r is the size of the dictionary, in itself a parameter to be either fixed a priori or estimated.

The major burden in computations is posed by the iterated updates of the motif occurrence lists, following the selection of the best candidate at each stage. Don't care pixels can be resolved or interpolated from neighboring ones. As we had observed in our earlier work, the bi-lateral context offered by motifs lends itself to better predictors than the traditional ones based on the left context alone.

The two important parameters with extensible motifs are (1) quorum K and (2) extensibility D. Empirically, the higher the quorum, the better the compression. This is because the number of candidate motifs is very large. However the motif detection time increases considerably. Again, the higher the value of D, the better the compression, although with larger losses. Clearly, there is a saturation value of D beyond which the restored image is unacceptable.

Figure 4:
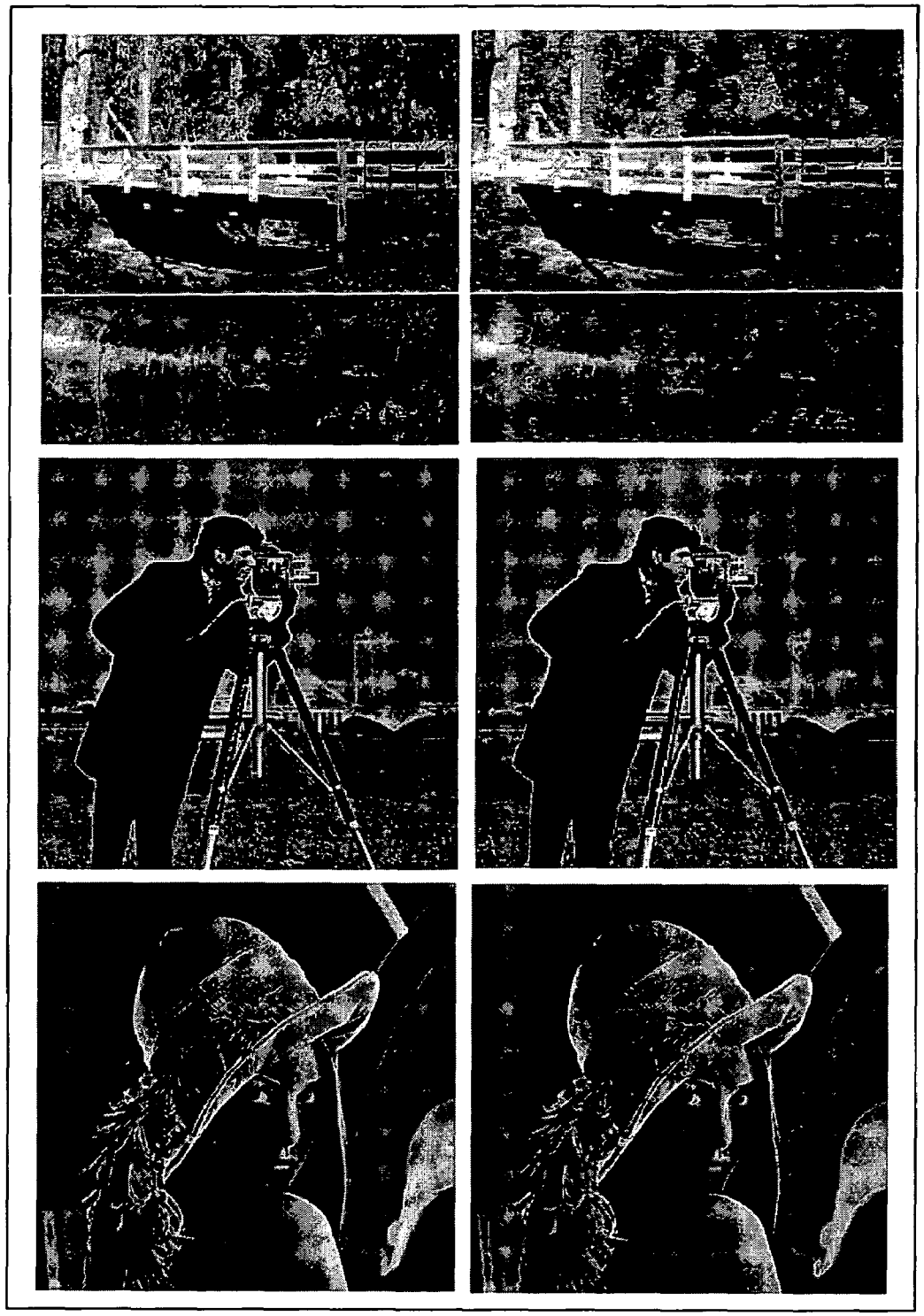
FIG. 4 shows some exemplary results using the compression method of the present invention.
Figure 6:
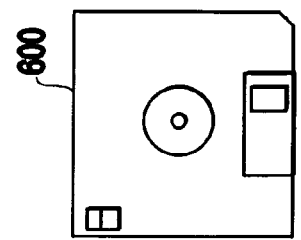
FIG. 6 illustrates a signal bearing medium 600 (e.g., storage medium) for storing steps of a program of a method according to the present invention.

FIG. 4 shows some examples of the result of the compression method of the present invention, with the original being on the left and the lossy (compressed) image on the right. One uses extensible motifs on the raw continuous data. The examples used here are images, as they can also be visually verified. The extensible motif has two components in its encoding: (1) the motif string; and (2) each occurrence and the size of each extension character at that occurrence.

In spite of the extra encoding required for the extensible portion of the motif, tremendous improvement is shown in the compression of data. Typical values for the data of the examples of FIG. 4 are as shown in the table below:

| data | motif params | orig size | comp size | compression | loss | diff |
| --- | --- | --- | --- | --- | --- | --- |
| bridge | K = 5, D = 4 | 66.336 | 38.279 | 43% | 40.11% | 4.4% |
| camera | K = 50, D = 2 | 66.336 | 44.636 | 33% | 12.29% | 0.042% |
| lena | K = 20, D = 3 | 262.944 | 141.576 | 47% | 40.27% | 1.99 |

Notice the tremendous amount of compression in the data (30-50%) with the loss (in terms of don't-care values) of about 40% in two of the data sets and. yet, after the reconstruction, more than 95% of the image is restored.

Thus, the present invention provides an effective compression method that is alternative to conventional methods using the frequency domain, while providing the capability for recovery of information lost in the process and the characteristic that loss of information is localized rather than universal.

Figure 5:
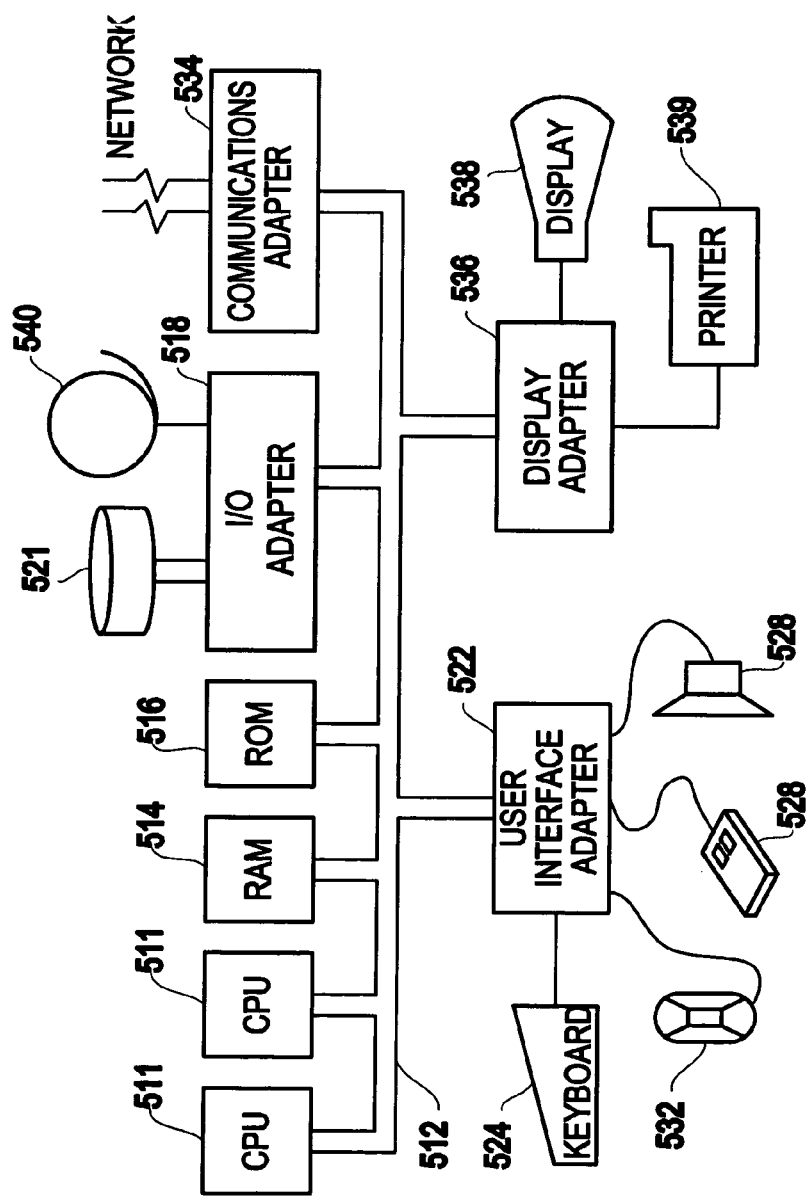
FIG. 5 illustrates an exemplary hardware/information handling system 500 for incorporating the present invention therein.

FIG. 5 illustrates a typical hardware configuration of an information handling/computer system in accordance with the invention and which preferably has at least one processor or central processing unit (CPU) 511.

The CPUs 511 are interconnected via a system bus 512 to a random access memory (RAM) 514, read-only memory (ROM) 516, input/output (I/O) adapter 518 (for connecting peripheral devices such as disk units 521 and tape drives 540 to the bus 512), user interface adapter 522 (for connecting a keyboard 524, mouse 526, speaker 528, microphone 532, and/or other user interface device to the bus 512), a communication adapter 534 for connecting an information handling system to a data processing network, the Internet, an Intranet, a personal area network (PAN), etc., and a display adapter 536 for connecting the bus 512 to a display device 538 and/or printer 539 (e.g., a digital printer or the like).

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, comprising signal-bearing media tangibly embodying a program of machine-readable instructions executable by a digital data processor incorporating the CPU 511 and hardware above, to perform the method of the invention.

This signal-bearing media may include, for example, a RAM contained within the CPU 511, as represented by the fast-access storage for example. Alternatively, the instructions may be contained in another signal-bearing media, such as a magnetic data storage diskette 600 (FIG. 6), directly or indirectly accessible by the CPU 511.

Whether contained in the diskette 600, the computer/CPU 511, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g. CD-ROM, WORM, DVD, digital optical tape, etc.), paper "punch" cards. or other suitable signal-bearing media including transmission media such as digital and analog and communication links and wireless. In an illustrative embodiment of the invention, the machine-readable instructions may comprise software object code.

While the invention has been described in terms of exemplary embodiments, those skilled in the art will recognize that the invention can be practiced with modification within the spirit and scope of the appended claims.

Further, it is noted that Applicants' intent is to encompass equivalents of all claim elements, even if amended later during prosecution.

Having thus described our invention, what we claim as new and desire to secure by Letters Patent is as follows:

1. A data processing method, comprising:
   receiving input data; and
   at least one of:
      when said input data comprises original data to be compressed, converting the received input data into a lossy data format wherein original data is approximated, at least partially, as at least one of:
         one or more extensible motifs, each said extensible motif having at least one don't-care character enclosed on a left side by at least one non-don't-care character and on a right side by at least one non-don't-care character; and
         one or more dictionary terms, each said dictionary term respectively comprising a symbol that represents at least one of said extensible motifs; and
      when said input data comprises data that is original data that was previously compressed into said lossy data format, said input data thereby being data to be decompressed, converting the received input data into a format that approximates the original data as a concatenation of only extensible motifs and any original data not converted into said extensible motifs.

2. The method of claim 1, wherein said input data comprises at least one of:
   text data; and
   image data.

3. The method of claim 1, said data compression comprising:
   developing a plurality of extensible motifs that approximates at least a part of said input data;

developing a dictionary of said dictionary terms, said
dictionary comprising symbols representing those
extensible motifs that occur at least a predetermined
number of times in said approximated original data;
and encoding said original data as represented by said dictionary terms and said extensible motifs.

4. The method of claim 1, said data compression further comprising:
determining enlargements of said extensible motifs for said input data.

5. The method of claim 1, said data decompression comprising:
when receiving at least some of said input data to be decompressed as dictionary terms, using a correlation between said dictionary terms and said extensible motifs to reconstruct said original data as decompressed data comprising extensible motifs that approximate said original data.

6. The method of claim 1, said data decompression comprising:
when said original data has been approximated as expressed only in said extensible motifs and any original data not converted into said extensible motifs, interpolating at least some of data in said extensible motifs to recover information represented as don't-care data.

7. The method of claim 1, wherein said extensible motifs are determined based on two positive integers, D and K, wherein D defines a lossy-ness parameter of a maximum number of don't-care characters for each said extensible motif and K defines a compression parameter that each said extensible motif occurs at least K times in said input data.

8. The method of claim 3, further comprising:
at least one of storing and transmitting said input data as compressed data comprising said extensible motifs, any appropriate said terms of said dictionary, any of said original data not converted into any extensible motif, and a listing that correlates said dictionary terms with extensible motifs represented thereby.

9. The method of claim 4, said data compression further comprising:
determining a set of maximal extensible motifs for said input data.

10. An apparatus, comprising at least one of:
a data compressor that:
receives input data as original data to be compressed; and
determines a plurality of extensible motifs so that said input data is at least partially approximated by a format based on said extensible motifs, each said extensible motif comprising at least one don't-care character enclosed on a left side by at least one non-don't-care character and on a right side by at least one non-don't-care character; and
a data decompressor that:
receives input data represented in said format based on said extensible motifs; and
reconstructs an approximation of said original data as a representation in said extensible motifs along with any original data not converted into any extensible motifs.

11. The apparatus of claim 10, wherein said data compressor further:

determines a dictionary of terms, each term comprising a symbol respectively representing at least one of said extensible motifs that occurs more than one time in said input data;
at least one of stores and transmits said input data as compressed data comprising one or more of any terms from said dictionary, any of said extensible motifs that are not represented as a term in said dictionary, any of original data elements not converted into an extensible motif, and a listing that correlates said dictionary terms and extensible motifs.

12. The apparatus of claim 10, wherein said data decompressor:
receives said input data for said data in a format comprising one or more of:
dictionary terms, each said dictionary term representing at least one of said extensible motifs that occurs more than a predetermined number of times in data,
any extensible motifs not converted into a dictionary term, and
any original data not converted into an extensible motiff;
receives a listing that correlates said dictionary terms with extensible motifs; and
reconstructs said data string as said concatenation of said original data not converted into an extensible motif, extensible motifs not converted into a dictionary term, and extensible motifs that correspond to said dictionary terms.

13. The apparatus of claim 11, wherein said data compressor determines said dictionary by using only said extensible motifs based on two positive integers, D and K, wherein D defines a lossy-ness parameter of a maximum number of don't-care characters for each said extensible motif and K defines a compression parameter that each said extensible motif occurs at least K times in data.

14. The apparatus of claim 12, wherein said data decompressor further:
interpolates data in the reconstructed input data to recover information represented as don't-care data in one or more of said extensible motifs.

15. A signal-bearing medium tangibly embodying a program of machine-readable instructions executable by a digital processing apparatus to perform at least one of a data compression and a data decompression wherein data is represented in a lossy data format as comprising one or more extensible motifs, each said extensible motif comprising at least one don't-care character enclosed on each of a left side and a right side by at least one non-don't-care character.

16. The signal-bearing medium of claim 15, said program of machine-readable instructions comprising at least one of:
a data compressor module that:
receives input data as original data to be compressed; and
determines a plurality of extensible motifs so that said input data can be approximated in a format based on said extensible motifs; and
a data decompressor module that:
receives input data having been previously represented in said format based on said extensible motifs; and
reconstructs an approximation of original data as a representation in said extensible motifs.

17. The signal-bearing medium of claim 16, wherein said data compressor module further:

determines a dictionary of terms, each term comprising a symbol that respectively represents at least one of said extensible motifs that occurs more than one time in said input data;

at least one of stores and transmits said input data as compressed data comprising one or more of terms from said dictionary, any remaining extensible motifs not listed in said dictionary, any of original data not converted into any extensible motif, and a listing that correlates said dictionary terms and extensible motifs represented thereby.

18. The signal-bearing medium of claim 16, wherein said data decompressor module further:

receives said input data for said data in a format comprising one or more of dictionary terms, each said dictionary term representing at least one of said extensible motifs that occurs more than a predetermined number of times in data, any extensible motifs not converted into a dictionary term, and any original data not converted into any extensible motif, and a listing that correlates said dictionary terms with extensible motifs therein; and reconstructs said approximation of original data as a representation in said extensible motifs along with any original data not converted into any extensible motifs.

19. The signal-bearing medium of claim 16, wherein said extensible motifs are determined based on two positive integers, D and K, wherein D defines a lossy-ness parameter of a maximum number of don't-care characters for each said extensible motif and K defines a compression parameter that each said extensible motif occurs at least K times in data.

20. The signal-bearing medium of claim 18, wherein said data decompressor module further:

attempts to interpolate data in the reconstructed input data string to recover information represented as don't-care data in one or more of said extensible motifs.

* * * * *